(12) United States Patent
Jones

(10) Patent No.: US 7,081,388 B2
(45) Date of Patent: Jul. 25, 2006

(54) SELF ALIGNED CONTACT STRUCTURE FOR TRENCH DEVICE

(75) Inventor: David P Jones, Penarth (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/084,265

(22) Filed: Feb. 28, 2005

(65) Prior Publication Data

US 2005/0189585 A1 Sep. 1, 2005

Related U.S. Application Data

(60) Provisional application No. 60/549,267, filed on Mar. 1, 2004.

(51) Int. Cl.
*H01L 21/336* (2006.01)

(52) U.S. Cl. ............... 438/270; 438/142; 438/197; 438/268; 257/213; 257/288; 257/327; 257/329; 257/330

(58) Field of Classification Search ............... None
See application file for complete search history.

(56) References Cited

U.S. PATENT DOCUMENTS

| | | | |
|---|---|---|---|
| 5,485,027 A | 1/1996 | Williams et al. ............ 257/343 |
| 5,929,481 A | 7/1999 | Hshieh et al. ............... 257/328 |
| 6,396,090 B1 * | 5/2002 | Hsu et al. | |
| 6,660,591 B1 * | 12/2003 | Peake et al. | |
| 2002/0008284 A1 * | 1/2002 | Zeng | |
| 2002/0185680 A1 * | 12/2002 | Henninger et al. | |

2003/0032247 A1 2/2003 Darwish et al. ............ 438/270

OTHER PUBLICATIONS

A Novel Technique for Fabricating High Reliaboe Trench DMOSFETs Using Self-Align Technique and Hydrogen Annealing, Jongdae Kim et al., IEEE Transactions on Electron Devices, vol. 50, No. 2, Feb. 2003.
A New Power W-Gated Trench MOSFET (WMOSFET) with High Switching Performance, Mohamed Darwish et al., pp. 24-27, ISPSD 2003, Apr. 14-17, Cambridge, United Kingdom.

* cited by examiner

*Primary Examiner*—Minhloan Tran
*Assistant Examiner*—Kevin Quinto
(74) *Attorney, Agent, or Firm*—Ostrolenk, Faber, Gerb & Soffen, LLP

(57) ABSTRACT

A fabrication process for a trench type power semiconductor device includes forming a mask layer with openings over a semiconductor surface. Through the openings of the mask, trenches with gates are then formed in the semiconductor body. Thereafter, insulation plugs are formed atop the gates and into the openings of the mask layer. The mask layer is then removed, leaving the insulation plugs extending above the semiconductor surface. Source implant regions are then formed between the trenches. Thereafter, spacers are formed along the sides of the insulation plugs, covering portions of the source implant regions adjacent the trenches. Using these spacers as masks, the exposed portions of the source implant regions are then etched and removed. The remaining source implant regions under the spacers are then driven to form source regions. Thereafter, shallow high conductivity contact regions are formed in the etched regions. Source and drain contacts are then formed over the device.

15 Claims, 11 Drawing Sheets

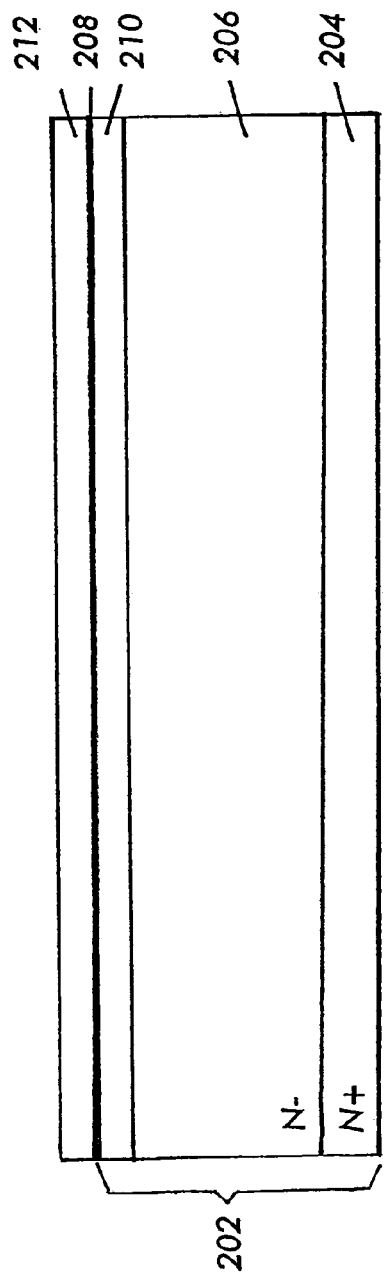
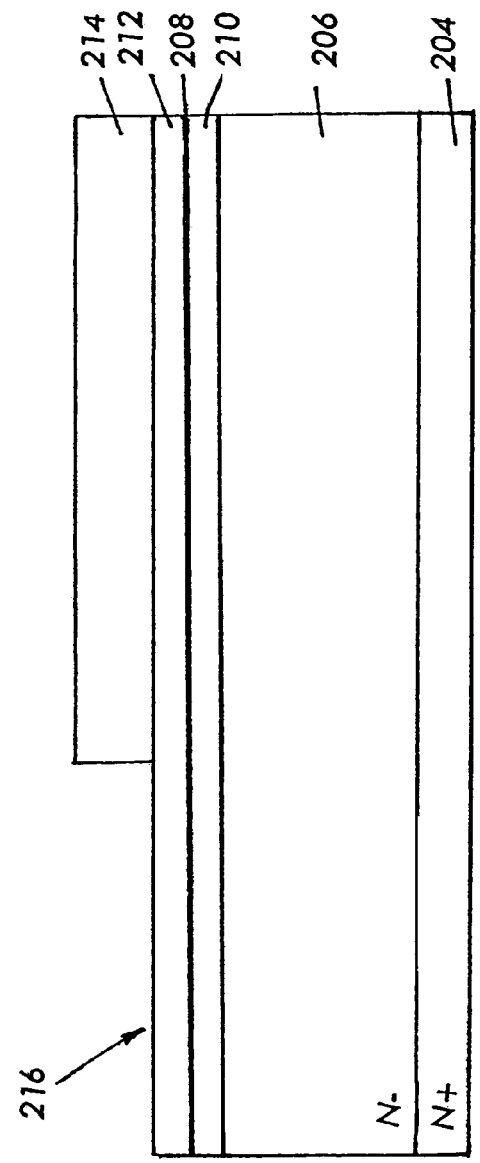
FIG. 3A
FIG. 3B

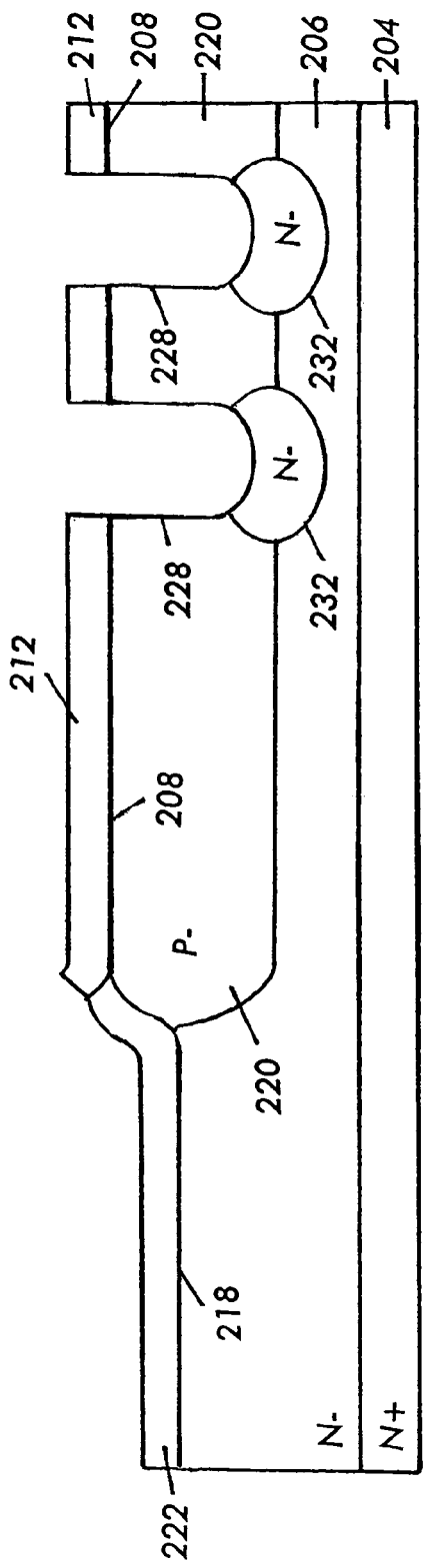
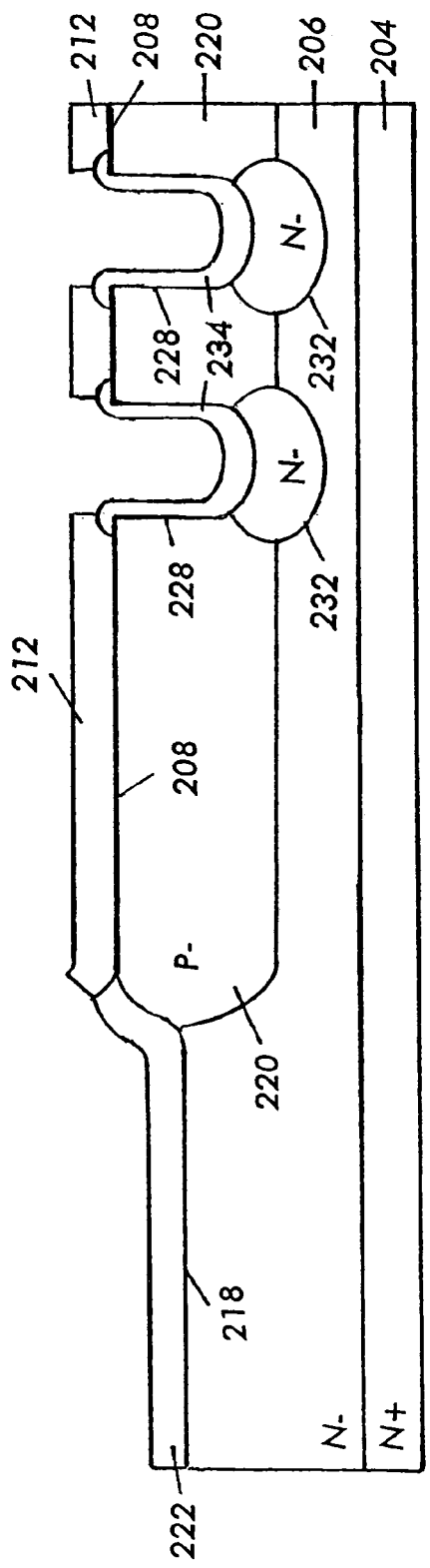
FIG. 3G
FIG. 3H

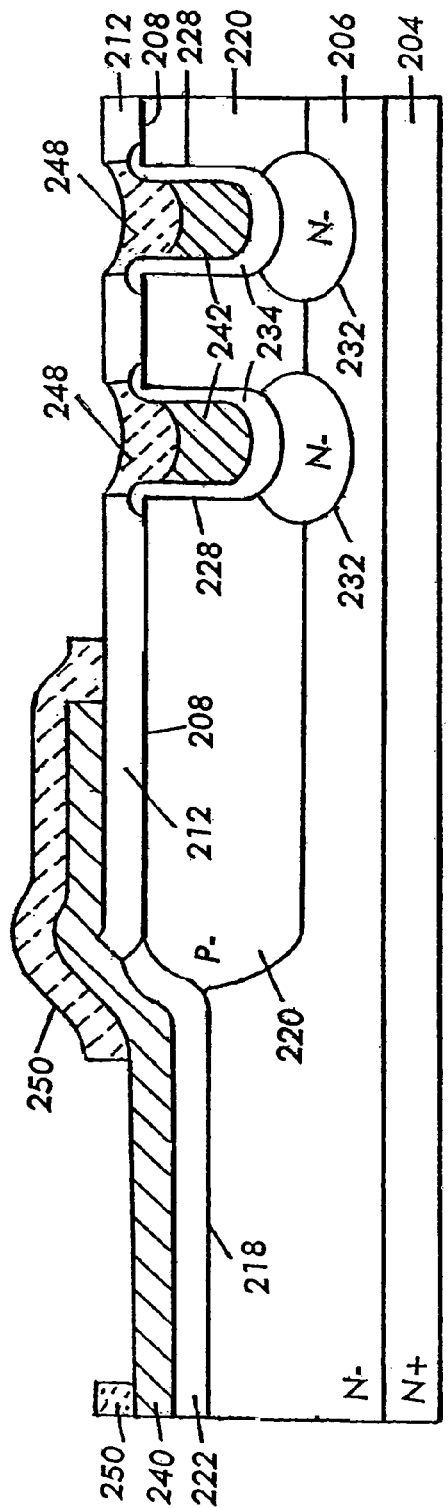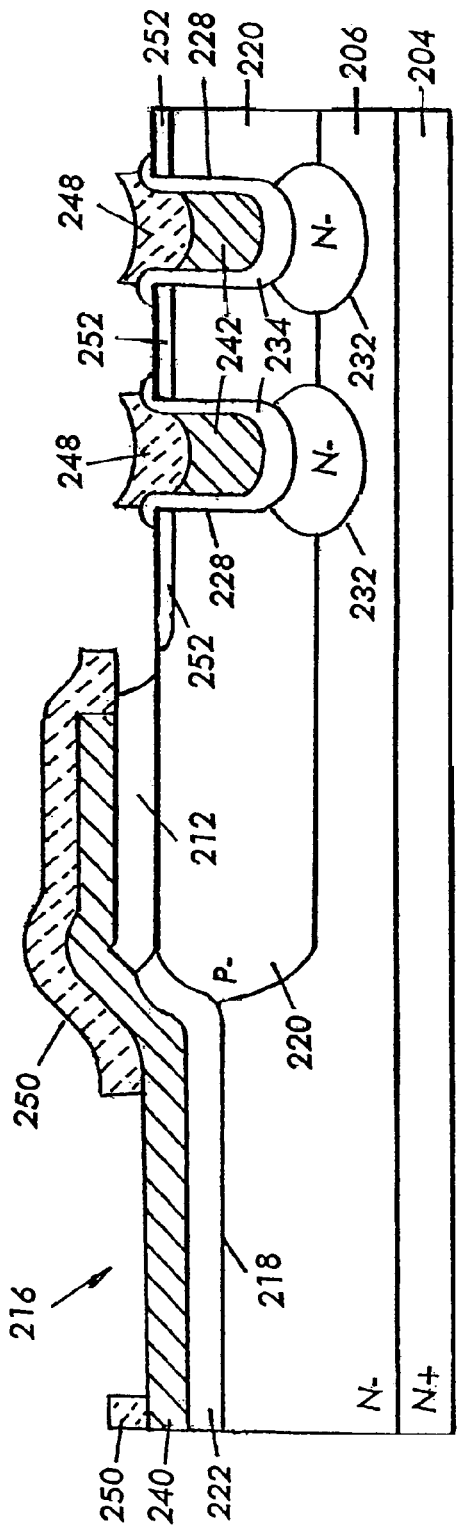

SELF ALIGNED CONTACT STRUCTURE FOR TRENCH DEVICE

RELATED APPPLICATIONS

This application is based on and claims priority to U.S. Provisional Application No. 60/549,267, filed on Mar. 1, 2004, by David P. Jones, entitled, "Self Aligned Contact Structure for Trench Device," the contents of which are herein incorporated by reference.

BACKGROUND OF THE INVENTION

1. Field of the Invention

The present invention relates generally to semiconductor devices, and more specifically, to trench type power semiconductor devices and a method for fabricating the same.

2. Description of Related Art

Trench type power semiconductor devices such as power MOSFETs are well known. Referring to FIG. 1, an example of a power MOSFET 100 according to prior art includes a plurality of trenches 12 formed in semiconductor body 14. Semiconductor body 14 is usually a silicon die that includes an epitaxially grown silicon layer (epitaxial silicon layer) 16 of one conductivity (e.g. N-type) formed over a silicon substrate 18 of the same conductivity, but of higher concentration of impurities. A channel region 20 (sometimes referred to as body region) is formed in epitaxial silicon layer 16 and extends from the top surface of the semiconductor body to a first depth. Channel region 20 has a conductivity opposite to that of epitaxial layer 16 (e.g. P-type). Formed within channel region 20 are source regions 22, which have the same conductivity (e.g. N-type) as epitaxial silicon layer 16.

As is well known, trenches 12 typically extend to a depth below the bottom of channel region 20 and include gate insulation 24, which may be formed with silicon dioxide, on at least the sidewalls of trenches 12. The bottom of each trench 12 is also insulated with silicon dioxide or the like. Gate electrodes 26 are disposed within each trench 12 and again, typically extend to a depth below the depth of channel region 20. Gate electrodes 26 are typically composed of conductive polysilicon.

A typical trench type power MOSFET further includes a source electrode 28, which is electrically connected to source regions 22, and high conductivity contact regions 30, which are also formed in channel region 20. High conductivity contact regions 30 are highly doped with dopants of the same conductivity as channel region 20 (e.g. P-type) in order to reduce the contact resistance between source electrode 28 and channel region 20. A typical trench type power MOSFET 10 further includes a drain electrode 32 in electrical contact with silicon substrate 18.

As is well known, the density of the current that power MOSFET 100 may accommodate is directly proportional to the cell density of the device. Thus, the greater the number of trenches per unit area the more current the device can handle. Because of this relationship, it is desirable to pack as many trenches as possible for a given die area. One way to accomplish this is by reducing the trench pitch, which, for example, requires reducing the width of source regions 22 and/or high conductivity contact regions 30. However, traditional fabrication processes can limit the amount of reduction that can be achieved in these dimensions, thereby affecting the amount of reduction that can be achieved in trench pitch.

As is also known, in prior art power semiconductor devices, such as MOSFET 100, trenches 12 must extend at least through the entire thickness of the channel region 20. Furthermore, the gate electrode 26 must also extend at least the length of the region that is to be inverted within the channel region. Naturally, when the thickness of the channel region is increased (e.g., to increase the breakdown voltage of the device) the gate trenches must be deeper and consequently the gate electrodes larger. Having larger gate electrodes is undesirable, however, as they include a larger volume of conductive material requiring a higher amount of charge to operate. Furthermore, a thicker channel region increases the on state resistance of the device as it increases the current path.

SUMMARY OF THE INVENTION

Accordingly, it would be desirable to produce a trench type power semiconductor device that overcomes the above and other disadvantages of the prior art. In a process according to the present invention, a hard mask layer is first formed over the surface of a semiconductor body, which includes a substrate and epitaxial silicon layer of a first conductivity and a channel region thereupon of a second conductivity. This mask layer is then etched to form a plurality of openings that extend to and expose the surface of the semiconductor body. Through these openings, gate electrode trenches are then formed into the semiconductor body. After forming a gate oxide along the sidewalls and bottom of the trenches, gate electrodes are formed in the trenches, these gate electrodes extending to a distance below the surface of the semiconductor body.

Next, an oxide insulation plug is formed from the top of each gate electrode such that each plug extends up and into the openings formed by the hard mask layer. Thereafter, the hard mask layer is removed, thereby leaving the oxide insulation plugs extending above the surface of the semiconductor body. Notably, these oxide insulation plugs are aligned to the gate electrode trenches.

Next, a source implant is carried out to form source implant regions in the surface of the semiconductor body in the areas between adjacent insulation plugs/trenches. Thereafter, spacers are formed along the sidewalls of the insulation plugs such that the spacers cover/mask portions of the source implant regions that are immediately adjacent to each trench. Significantly, the spacers are aligned to the insulation plugs and thereby to the trenches and as such, the openings formed between adjacent spacers are also aligned to the plugs and trenches.

Next, using the spacers as masks, a contact etch is performed along the surface of the semiconductor body, thereby removing any unmasked portions of the source implant regions and exposing the top surface of the channel region along the etched region. However, because of the spacers, the source implant regions immediately adjacent the trenches are retained. Thereafter, a source diffusion drive is carried out to drive the remaining portions of the source implant regions, thereby forming source regions adjacent to the trenches Significantly because of the spacers, these source regions are self-aligned to the trenches.

Next, using dopants of the same conductivity as the channel region, a low energy contact implant is performed in the channel region along the etched region created by the contact etch. This implant is then driven using an RTA (rapid thermal annealing) process or furnace drive, thereby forming shallow high conductivity contact regions. Significantly, because of the spacers, these high conductivity contact regions are self-aligned to the source regions and trenches. Source and drain contacts are then formed.

In accordance with the present invention and as described above, by forming the source regions and high conductivity contact regions through the aligned insulation plugs and spacers, the source regions are self-aligned between adjacent gate trenches and the high conductivity contact regions are self-aligned between adjacent source regions and gate trenches. As a result of forming the high conductivity contact regions through this self-alignment procedure, these contact regions are not limited by prior fabrication processes, such as photolithography, and have a reduced width. For example, the high conductivity contact regions of the present invention are only 0.2 microns wide. This reduced dimension allows the trench pitch of the resulting device to be reduced to approximately 0.8 microns, for example, as compared to prior trench pitches of approximately 1.8 microns. This reduced trench pitch allows the resulting device to have an increased cell density.

Other features and advantages of the present invention will become apparent from the following description of the invention, which refers to the accompanying drawings.

DETAILED DESCRIPTION OF THE PREFERRED EMBODIMENTS

Figure 1:
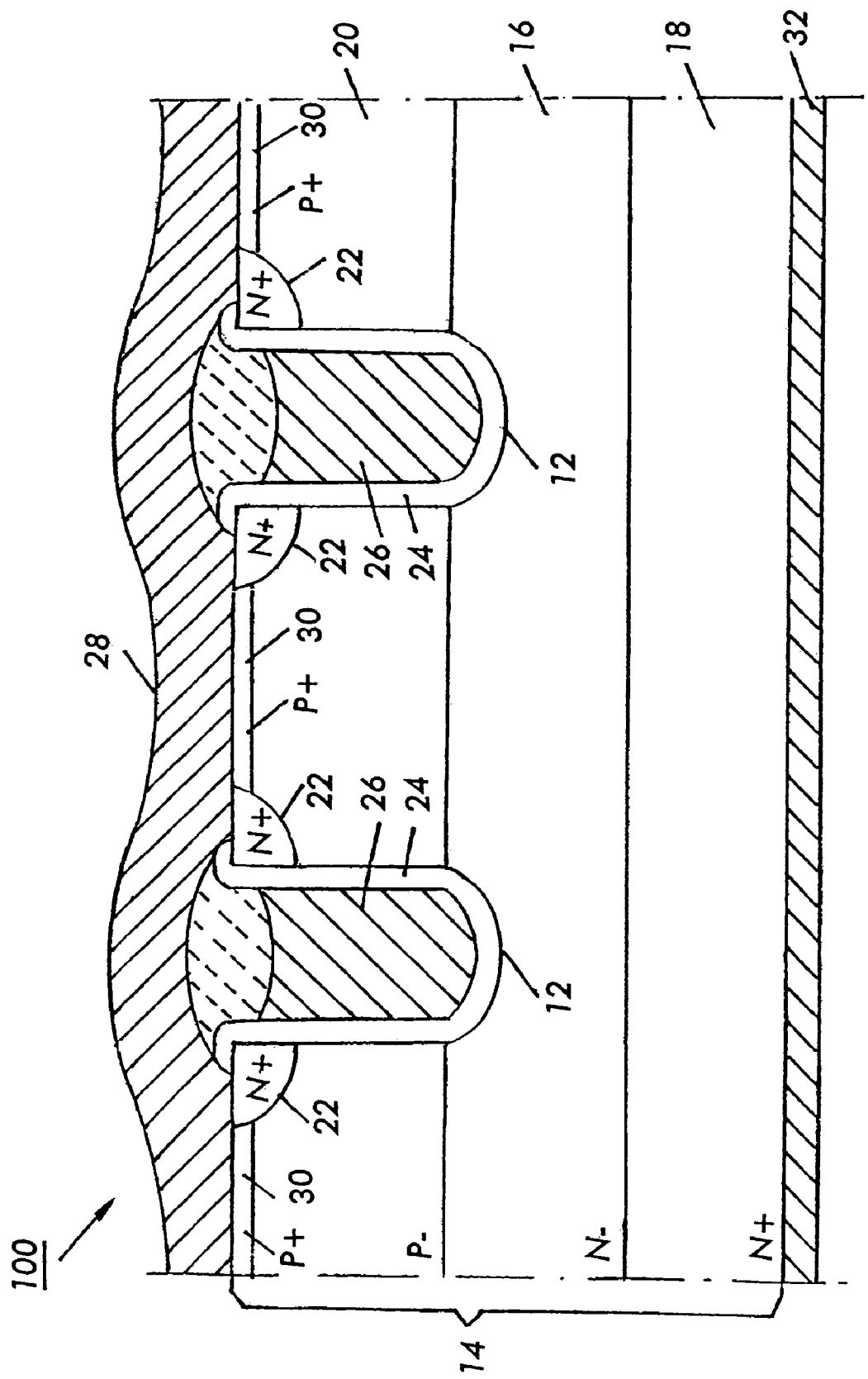
FIG. 1 shows a cross-sectional view of a portion of the active region of a trench type power MOSFET according to the prior art.
Figure 2:
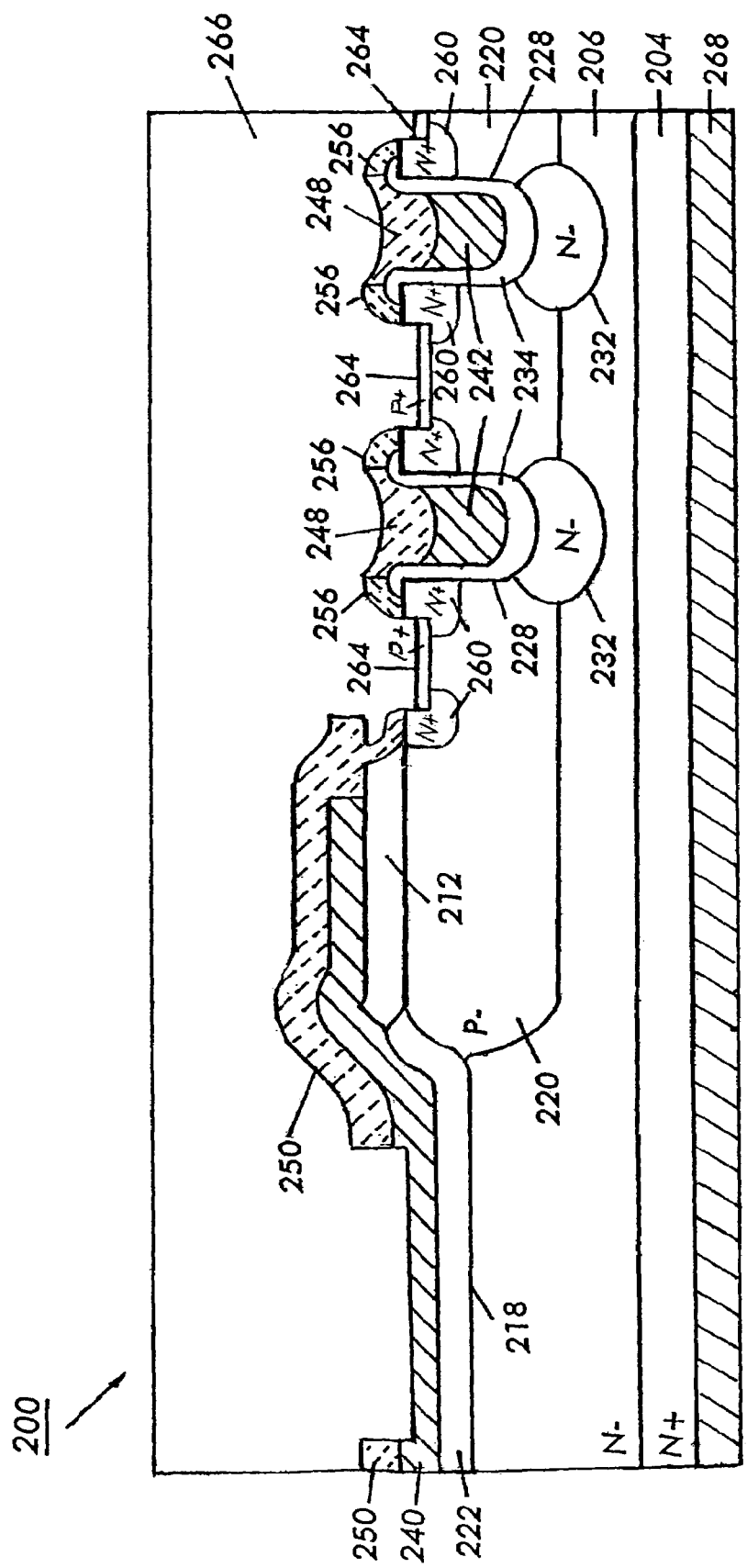
FIG. 2 shows a cross-sectional view of a portion of the active region a trench-type power MOSFET according to an embodiment of the present invention.

Referring to FIG. 2, a power MOSFET 200 in accordance with the present invention includes source regions 260 that are self-aligned between adjacent gate trenches 228 and further includes high conductivity contact regions 264 that are self-aligned between adjacent source regions 260 and gate trenches 228, thereby reducing the trench pitch of the device. Specifically, according to the present invention, oxide insulation plugs 248 are grown from the top of gate electrodes 242, which plugs are aligned to trenches 228. In turn, spacers 256 are formed along the walls of oxide insulation plugs 248 and are aligned to these plugs. Through spacers 256, source regions 260 and high conductivity contact regions 264 are formed, causing the source regions and high conductivity contact regions to be self-aligned between each other and trenches 228. As a result of forming the high conductivity contact regions of the present invention through this self-alignment procedure, the contact regions are not limited by prior fabrication processes, such as photolithography, and have a reduced width. For example, high conductivity contact regions 264 are only 0.2 microns wide. This reduced dimension allows the trench pitch of the device to be reduced to approximately 0.8 microns, as compared to prior trench pitches of approximately 1.8 microns. This reduced trench pitch allows power MOSFET 200 to have an increased cell density.

As further illustrated in FIG. 2, gate trenches 228 are shallow and extend to a distance above the bottom of channel region 220 and do not extend into epitaxial silicon layer 206. Rather, at the bottom of each trench 228 is a low concentration trench tip implant 232, having the same conductivity as epitaxial silicon layer 206. These trench tip implants extend through channel region 220 and into underlying epitaxial silicon layer 206. The trench tip implants reverse the doping in the regions immediately below each trench 228, effectively pulling up the drift region in a very localized fashion. As also illustrated in FIG. 2, gate oxide 234 lining trenches 228 is thicker along the bottom of trenches 228 as compared to the sidewalls of the trenches.

Significantly, through the combination of shallower trenches 228 and trench tip implants 232, adverse affects due to trench depth variations can be reduced. Also, on-state resistance can be improved without reducing the thickness of the channel region and thus compromising breakdown voltage. In addition, the shallower trenches 228 allow for the gate resistance (Rg) and gate charge (Qg) of gate electrodes 242 of MOSFET 200 to be reduced. Also, trench tip implants 232 can reduce the gate-drain charge (Qgd) by about 40%, for example. The thick gate oxide 234 along the bottom of trenches 228 further reduces the gate-drain charge (Qgd). Overall, because the gate-drain charge is reduced, the charge ratio, Qgd/Qgsb, of MOSFET 200 is improved (the ratio is less than 1).

Figure 3C:
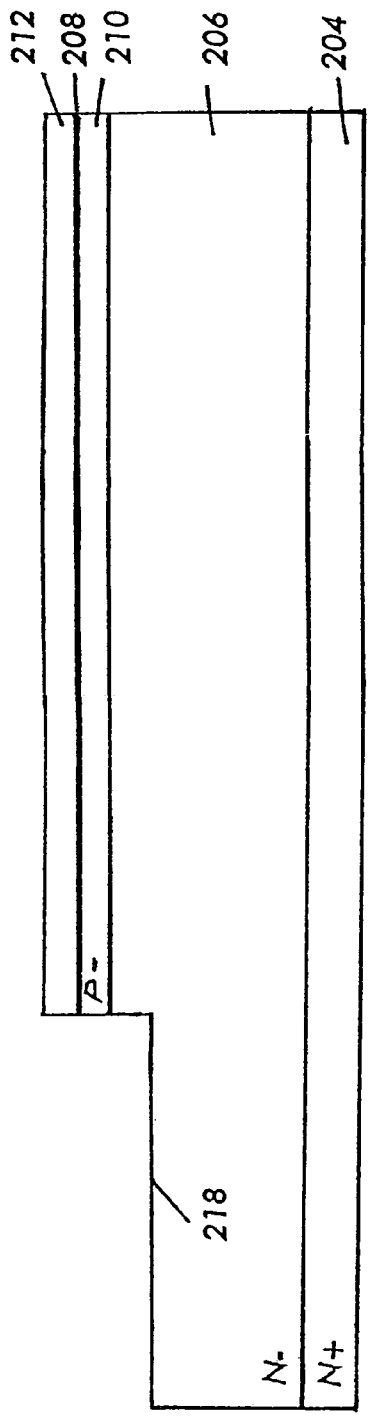
FIGS. 3A–3R graphically illustrate a process according to an embodiment of the present invention for fabricating the trench-type power MOSFET of FIG. 2.
Figure 3D:
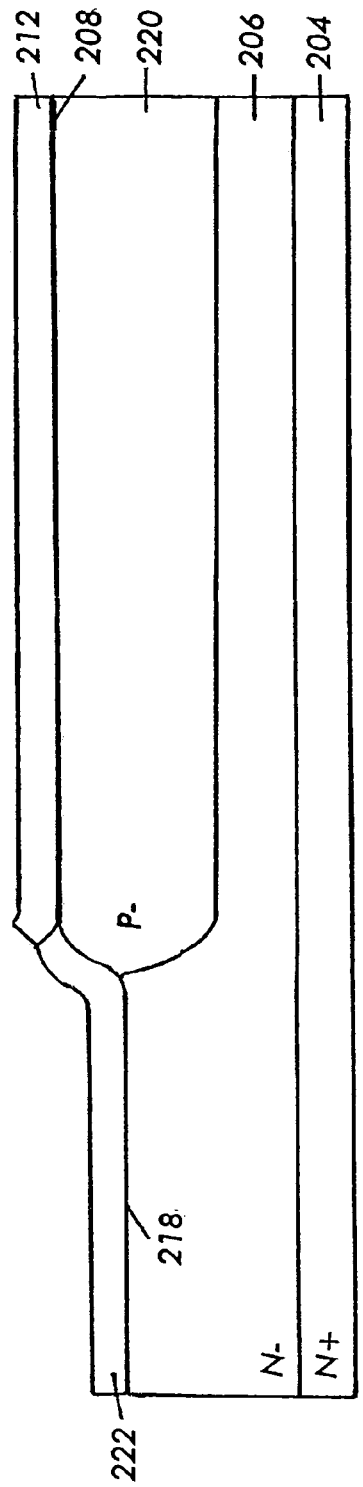
Figure 3E:
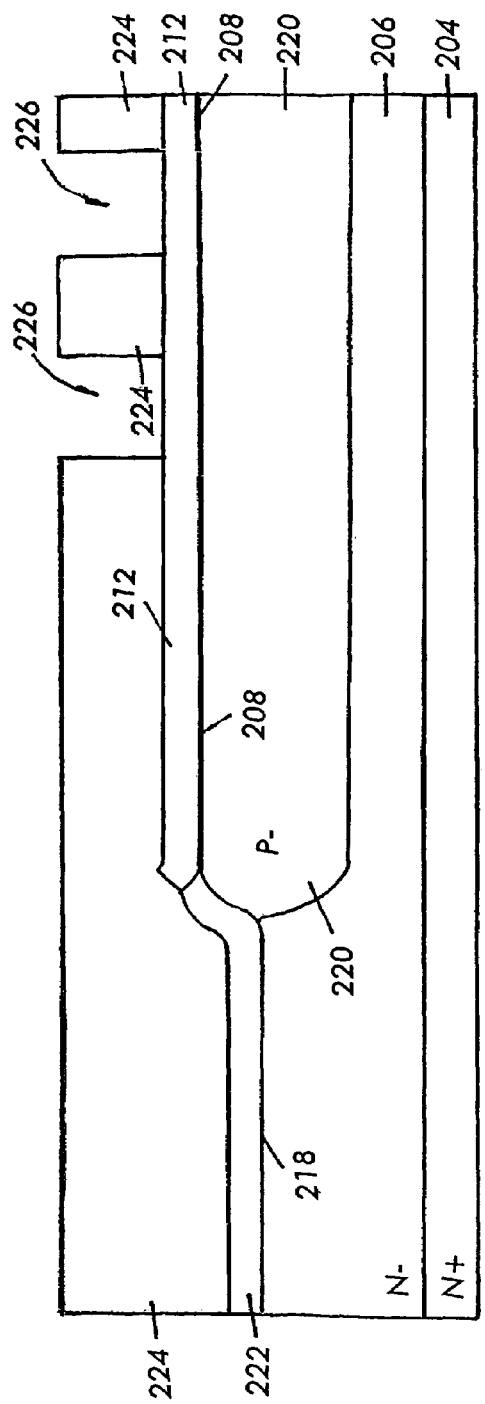
Figure 3F:
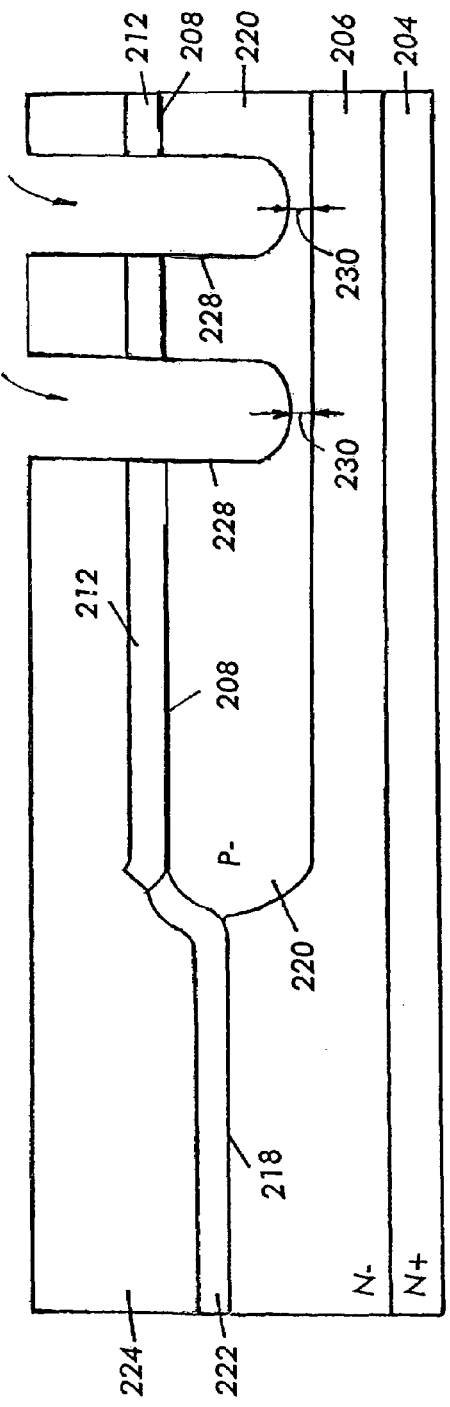
Figure 3I:
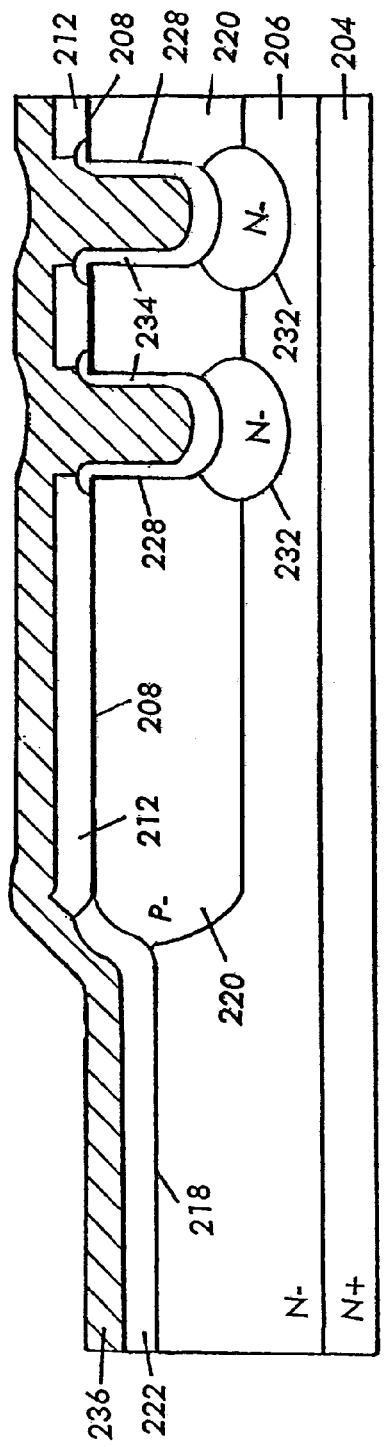
Figure 3J:
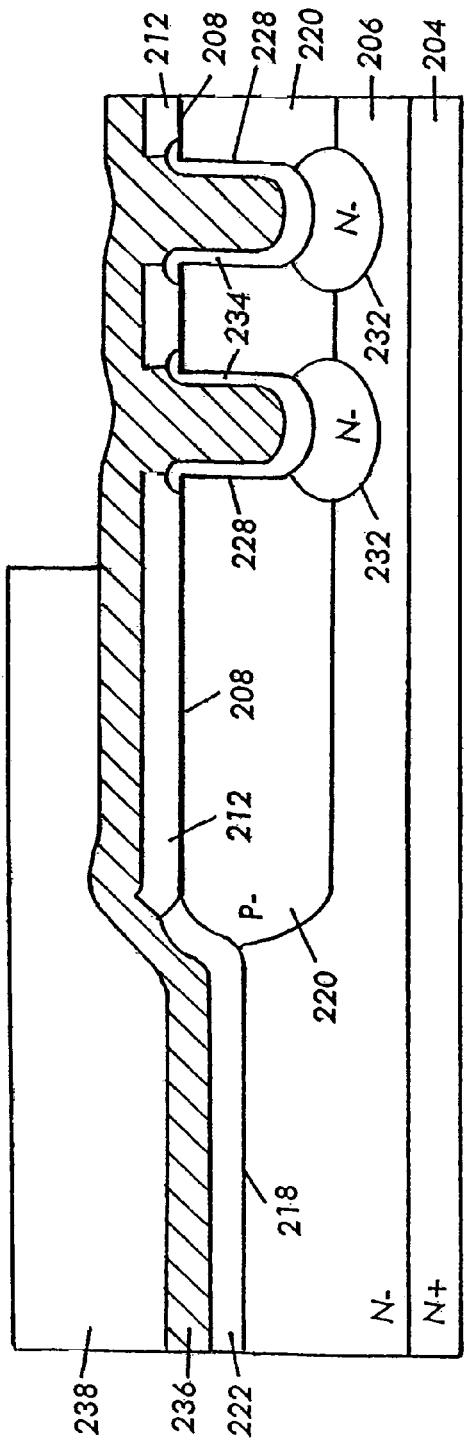
Figure 3K:
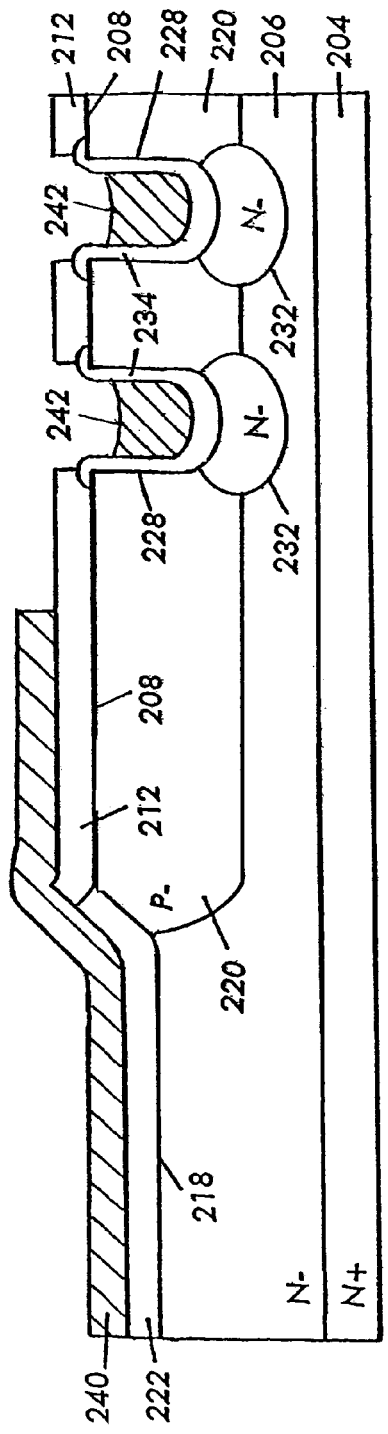
Figure 3L:
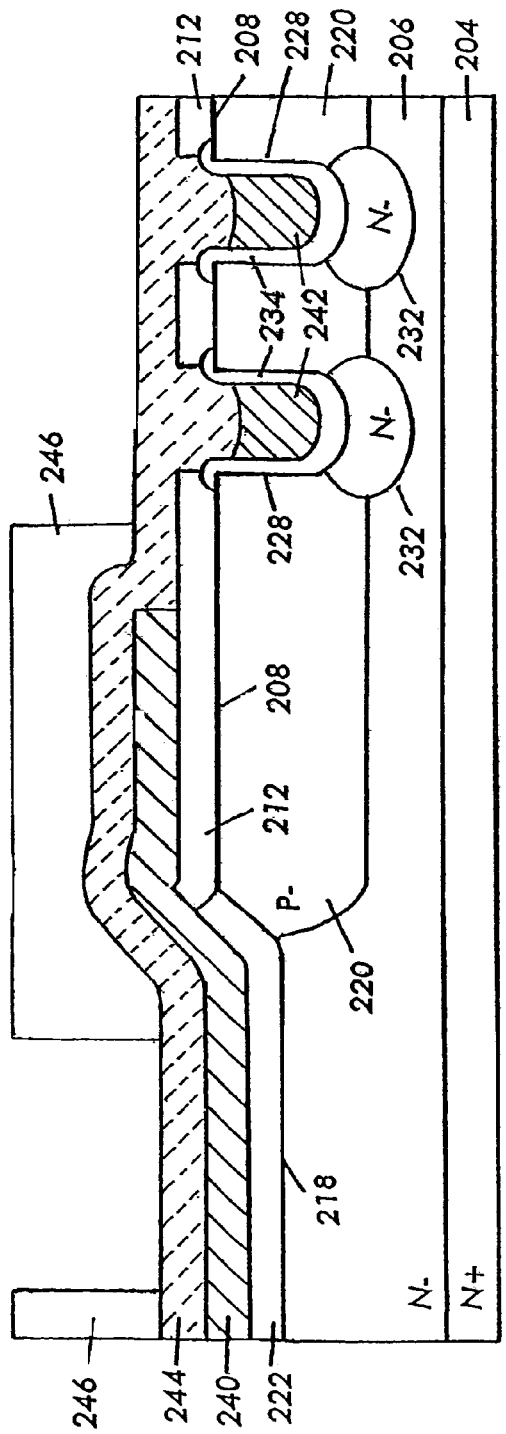
Figure 3O:
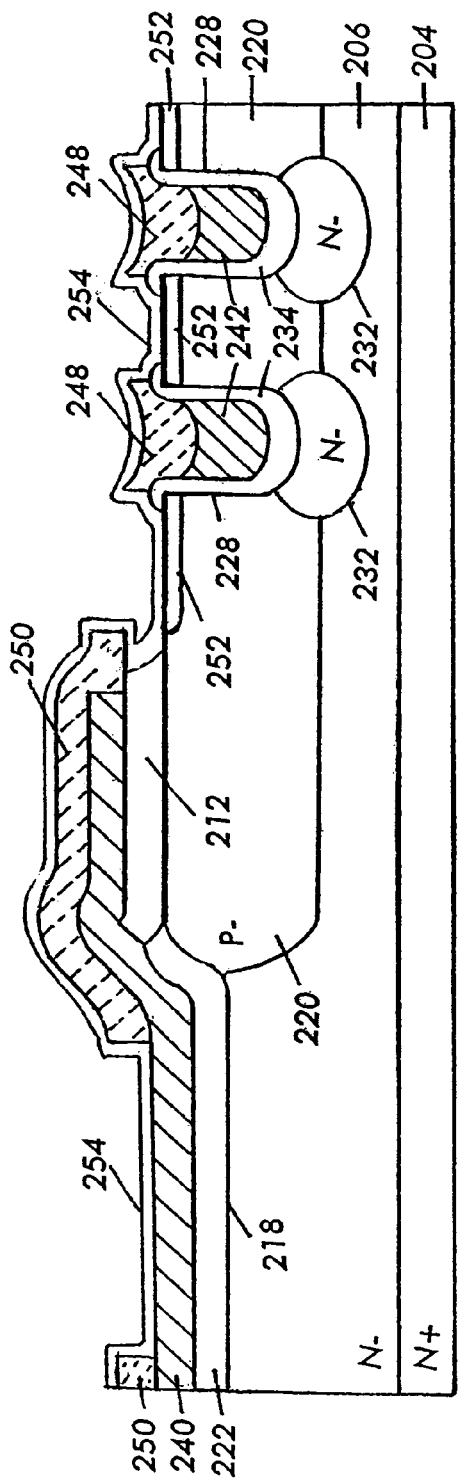
Figure 3P:
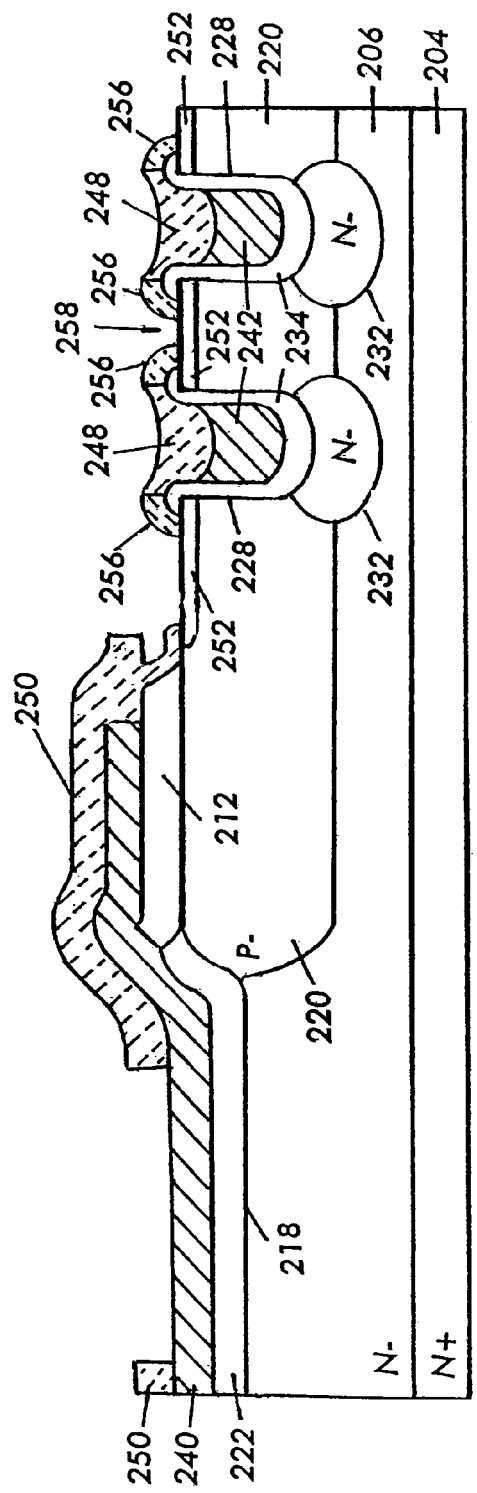
Figure 3Q:
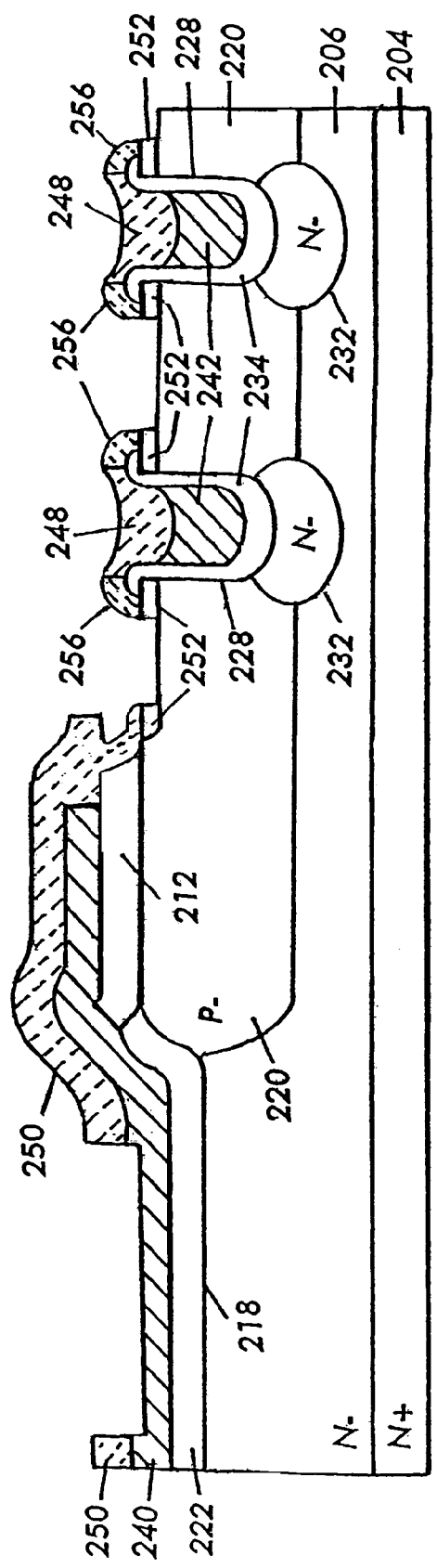
Figure 3R:
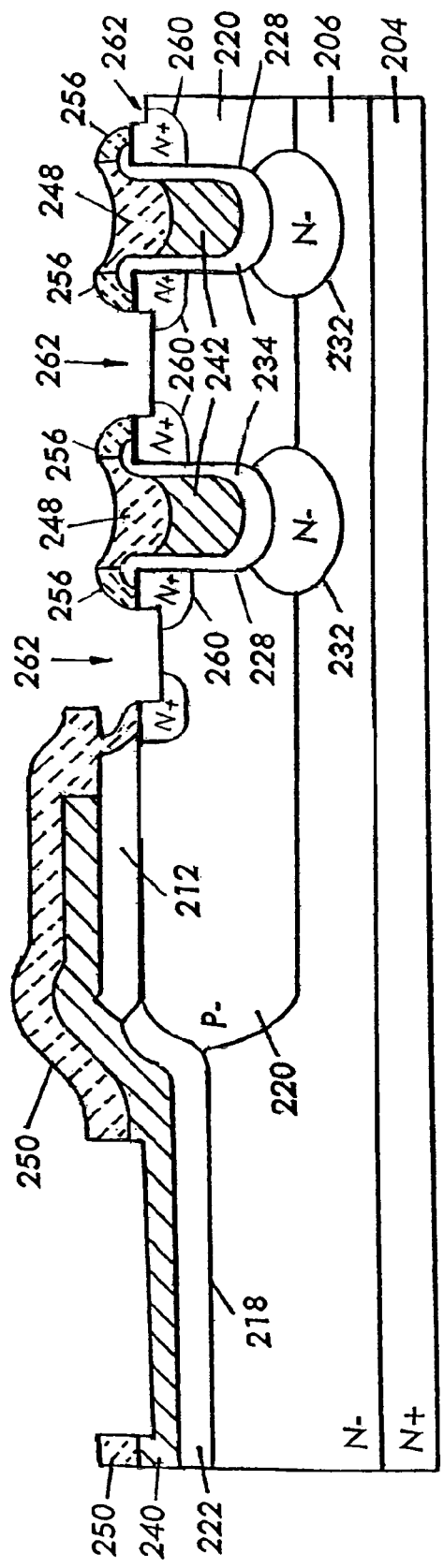

Referring now to FIGS. 3A–3R (note that the Figures are not drawn to scale), an example process for fabricating the trench type power MOSFET 200 of FIG. 2 according to an embodiment of the present invention is illustrated. Beginning with FIG. 3A, there is shown an initial silicon body 202. Silicon body 202 preferably includes a silicon substrate 204 of one conductivity (e.g., N-type) and epitaxial silicon layer 206 of the same conductivity (e.g., N-type) grown over one major surface of silicon substrate 204. As is known, epitaxial silicon layer 206 includes a lower concentration of dopants as compared to substrate 204. Preferably, epitaxial silicon layer 206 has a resistivity of approximately 0.21 Ohm cm. Once having epitaxial silicon layer 206, a pad oxide 208 is formed on the surface thereof, at a thickness of preferably about 230 A. A channel implant is then carried out using dopants of a conductivity opposite to that of epitaxial silicon layer 206 (e.g. P-type) thereby forming channel implant region 210 within epitaxial silicon layer 206. Preferably, channel implant region 210 is formed using an ion dose and energy of 2.7E13 and 50 KeV, respectively. Note that channel implant region 210 is not driven/activated at this time. On the surface of pad oxide 208 a hard mask layer 212 is then formed, preferably composed of silicon nitride ($Si_3Ni_4$), at a thickness of approximately 4000A or greater. As discussed below, this hard mask layer is retained through the formation of gate trenches 228 and oxide insulation plugs 248.

Referring to FIG. 3B, termination trench mask 214 is next formed on the surface of hard mask layer 212, exposing a portion of mask layer 212 along termination region 216. Termination trench mask 214 may be a layer of photoresist, for example, and thereby formed using a conventional photolithographic process. Thereafter, termination trench 218 is formed by etching a groove along the unmasked termination region 216. The groove extends through hard mask layer 212/pad oxide 208 and into epitaxial silicon layer 206 to a depth below channel implant region 210. Termination trench mask 214 is then removed. The resulting structure is shown in FIG. 3C.

Referring to FIG. 3D, a channel drive is next performed, preferably for 45 minutes at 1110° C., thereby forming channel region 220 within epitaxial silicon layer 206. Thereafter, field oxide 222 is simultaneously grown over the sidewall and the bottom of termination trench 218, preferably using a wet process at a temperature of 1050° C. for 70 minutes. Note that because of hard mask layer 212, only the bottom and the sidewall of termination trench 218 are oxidized during this step.

Referring to FIG. 3E, active trench mask 224 is next formed over the surface of the structure shown in FIG. 3D, this mask having spaced openings 226 that extend to the surface of hard mask layer 212 within the active area. Active trench mask 224 can be formed, for example, by applying a layer of photoresist and a mask with a desired trench pattern to the surface of the structure and then patterning the layer of photoresist using a suitable photolithographic process.

Referring to FIG. 3F, an active trench etch is next carried out through openings 226 to form trenches 228 within the active area of the structure. Significantly, note that the bottom of trenches 228 extend to a distance above the bottom of channel region 220 and as such, do not extend into epitaxial silicon layer 206. Specifically, the energy used to form channel implant region 210 and the drive used to form channel region 220 are targeted such that the trench etch results in trenches 228 that are shallower than channel region 220 by preferably about 0.1 um or greater (as illustrated by distance 230 in FIG. 2F).

Referring to FIG. 3G, using low dose, low energy dopants of the same conductivity as epitaxial silicon layer 206 (e.g. N-type), preferably phosphorous, trench tip implants 232 are formed at the bottom of trenches 228. Note that trench tip implants 232 extend through channel region 220 and into underlying epitaxial silicon layer 206. Again, trench tip implants 232 reverse the doping in the region immediately below each trench 228, effectively pulling up the drift region in a very localized fashion. Significantly, the trench tip implant concentration is low enough to deplete out in reverse bias but still high enough not to create a JFET. Once trench tip implants 232 are formed, active trench mask 224 is removed.

Referring to FIG. 3H, gate oxide 234 is next formed on the sidewalls and bottom of trenches 228 using a LOCOS process such that the oxide layer formed along the bottom of each trench 228 is thicker than the oxide layer formed along the sidewalls of each trench, as illustrated in the Figure. Specifically, a sacrificial oxide layer ($SiO_2$) is first simultaneously grown on the sidewalls and bottom of each trench 228 (note that this step and the following steps used to form gate oxide 234 are not shown in the Figures). A sacrificial oxide etch is then performed to completely remove this oxide layer. Next a pad oxide is formed on the sidewalls and bottom of each trench 228. Thereafter, a removable hard mask layer, preferably composed of silicon nitride, is deposited over the surface of the structure of FIG. 3G, including the sidewalls and bottom of trenches 228. Then, using a dry nitride etch, the hard mask layer is removed from the surface of the structure and from the bottom of each trench 228, thereby forming nitride spacers along the sidewalls of each trench 228 and exposing the bottom of each trench.

Thereafter, a thermally grown thick bottom oxide is formed along the bottom each trench 228. Significantly, the nitride spacers along the sidewalls of each trench prevent oxide growth on the sidewalls during this step. Next, a wet nitride etch is performed to strip the nitride spacers from the trench sidewalls. Finally, an oxide layer is thermally grown along the sidewalls and bottom of each trench, with the resulting structure shown in FIG. 3H. Again, the formation of gate oxide 234 in this fashion results in the oxide layer formed along the bottom of each trench being thicker than the oxide layer formed along the sidewalls of each trench. In particular, the thickness of gate oxide 234 at the bottom of each trench can be targeted to be about 1.5 to 4 times the thickness of gate oxide 234 along the sidewalls of each trench.

Referring to FIG. 3I, a layer of un-doped polysilicon 236 is next deposited on the surface of the structure of FIG. 3H, thereby filling trenches 228, and covering hard mask layer 212 and field oxide 222 along termination trench 218. Thereafter, POCl deposition and diffusion is carried out to make the polysilicon N type and conductive. The top surface of the structure is then deglassed.

Referring to FIG. 3J, polysilicon mask 238 is next formed partially over the surface of the structure of FIG. 3I, exposing the surface of doped polysilicon 236 substantially over the active area of the structure. Polysilicon mask 238 is preferably composed of silicon nitride and can be formed, for example, by applying a layer of silicon nitride to the structure of FIG. 3I and appropriately etching the same.

Next, using polysilicon mask 238 as an etch stop for end point detection, the exposed/unmasked polysilicon 236 over the active area is etched back using a timed plasma etch such that the unmasked polysilicon is removed from the surface of the structure, thereby exposing a portion of hard mask layer 212, and is further removed from within trenches 228 such that the polysilicon is recessed within the trenches to preferably about 2000 A below the top surface of the silicon. Polysilicon mask 238 is then removed. As a result of this step, field relief electrode 240 is formed over field oxide 222 in termination trench 218 and over a portion of hard mask layer 212, and gate electrodes 242 are formed within trenches 228, as illustrated in FIG. 3K.

Next, after growing a polyoxide atop gate electrodes 242 and field relief electrode 240 (not shown in the Figures), oxide layer 244 composed, for example, from TEOS, is formed over the surface of the structure of FIG. 3K, filling trenches 228 up above hard mask layer 212, as illustrated in FIG. 3L. In this way, a plug is grown over from the top of gate electrodes 242, as further described below. Thereafter, plug-termination contact mask 246 is partially formed over the surface of oxide layer 244, exposing the surface of oxide layer 244 over termination trench 218 and over the active area, as further illustrated in FIG. 3L. Plug-termination contact mask 246 is preferably composed of silicon nitride and can be formed, for example, by applying a layer of silicon nitride to the surface of the structure and appropriately etching the same.

Next, using plug-termination contact mask 246 as an etch stop for end point detection, the exposed oxide layer 244 is etched back thereby exposing a portion of field relief electrode 240 and exposing a portion of hard mask layer 212 within the active area. However, oxide layer 244 is left within trenches 228 substantially to the top surface of hard mask layer 212. In this way, oxide insulation plugs 248 are formed over the tops of gate electrodes 242. Significantly, plugs 248 are aligned to trenches 228. Thereafter, plug-termination contact mask 246 is removed, leaving insulation body 250 over field relief electrode 240. The resulting structure is illustrated in FIG. 3M.

Referring to FIG. 3N, a wet nitride etch is next carried out to completely remove hard mask layer 212 (except for that portion of the mask covered by field relief electrode 240 and insulation body 250), thereby leaving oxide insulation plugs 248. During this step, all or a portion of pad oxide 208 is also removed. Then, following a pre-source implant dry oxide etch, source implant regions 252 are formed in channel region 220 between trenches 228, as illustrated in FIG. 3N. Preferably, source implant regions 252 are formed using an ion dose and energy of 2E16 and 50 KeV, respectively. Note that the source implant is carried out using a photoresist mask that blocks the source from termination region 216.

Referring to FIG. 3O, spacer layer 254 is next formed over the surface of the structure shown in FIG. 3N. Spacer layer 254 preferably has a thickness of 1000 A or greater and is composed of TEOS or silicon nitride. Next, using an appropriate etching process, spacer layer 254 is etched back from the surface of the structure to expose the surface of source implants 252 and the surface of field electrode 240. Significantly, however, in etching back spacer layer 254, spacers 256 are formed along the walls of oxide insulation plugs 248, as illustrated in FIG. 3P (note that any remaining spacer layer 254 over insulation body 250 is shown as part of insulation body 250 in FIG. 3P). Note that spacers 256 cover a portion of source implant regions 252 immediately adjacent each trench 228. Significantly, spacers 256 are aligned to oxide insulation plugs 248 and thereby to trenches 228. As such, openings 258 formed between adjacent spacers are also aligned to oxide insulation plugs 248 and thereby to trenches 228.

Next, using spacers 256 as a mask, a contact etch is performed along the surface of source implant regions 252. This contact etch preferably removes approximately 1500 A or greater of silicon to ensure any unmasked portions of source implant regions 252 are removed, thereby exposing a portion of the top surface of channel region 220. Nonetheless, because of spacers 256, the source implant region immediately adjacent to trenches 228 is retained. Note that this etching step also establishes contact to the polysilicon gate runners (not shown in the Figures). It should also be noted that during this step, the exposed surface of field relief electrode 240 is also etched, removing a portion thereof. The resulting structure is shown in FIG. 3Q.

Referring to FIG. 3R, a source diffusion drive is next carried out to drive the remaining portions of source implant regions 252 that are masked by spacers 256, thereby forming source regions 260. Note that the source implant regions are preferably driven such that the resulting source regions 260 overlap gate electrodes 242 in trenches 228 by approximately 500 A or greater. Significantly, because of spacers 256, source regions 260 are self-aligned to trenches 228.

Referring to FIG. 2, using dopants of the same conductivity as channel region 220, a low energy contact implant is next performed in channel region 220 along the etched region created by the contact etch in FIG. 3Q (i.e., the area designated by arrow 262 in FIG. 3R). This implant is then driven using an RTA (rapid thermal annealing) process or furnace drive, thereby forming shallow high conductivity contact regions 264. Significantly, because of spacers 256, high conductivity contact regions 264 are self-aligned to source regions 256 and trenches 228. Again, by forming the high conductivity contact regions through this self-alignment procedure, the contact regions are not limited by prior fabrication processes, such as photolithography, and have a reduced width and can be, for example, only 0.2 microns wide. This reduced dimension allows the trench pitch to be reduced to approximately 0.8 microns, as compared to prior trench pitches of approximately 1.8 microns.

Finally, a front metal and back metal are applied using known methods to obtain source contact 266 and drain contact 268.

Note that FIGS. 2 and 3A–3R show N-type trench MOSFETs. Nonetheless, one skilled in the art will realize that the present invention also applies to P-type trench MOSFETS.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A method for fabricating a power semiconductor device, comprising the steps of:
    forming a first mask layer over a surface of a semiconductor body of a first conductivity;
    patterning said first mask layer with a plurality of first openings, wherein each of said plurality of first openings extends towards the surface of said semiconductor body;
    defining trenches in said semiconductor body by etching said semiconductor body through said first openings;
    forming a gate electrode in each of said trenches;
    forming an insulation plug atop each of said gate electrodes, each plug extending above the surface of said semiconductor body and into a respective first opening in said mask layer;
    forming spacers along sidewalls of each of said insulation plugs, wherein said spacers define second openings to the surface of said semiconductor body; and
    using said spacers to form regions of a second conductivity along the surface of said semiconductor body and aligned to adjacent trenches.

2. The method of claim 1, wherein said spacers using step comprises the steps of:
    contacting etching the surface of said semiconductor body through said spacers thereby forming etched regions; and
    forming said regions of said second conductivity along said etched regions.

3. The method of claim 2, wherein said forming step comprises the steps of:
    performing a low energy contact implant along each of said etched regions; and
    annealing said low energy contact implants using rapid thermal annealing (RTA).

4. The method of claim 1, further comprising, after said insulation plugs forming step, the step of forming implant regions of said first conductivity in the surface of said semiconductor body between trenches such that said spacers formed in said spacers forming step partially mask said implant regions in areas immediately adjacent to each of said trenches, unmasked portions of said implant regions being exposed by said second openings.

5. The method of claim 4, wherein said spacers using step comprises the steps of:
    contacting etching and thereby completely removing said unmasked portions of said implant regions, thereby forming etched regions; and
    forming said regions of said second conductivity along said etched regions.

6. The method of claim 5, further comprising after said contact etching step the step of driving said implant regions masked by said spacers to form a plurality of source regions.

7. The method of claim 1, wherein each of said regions of said second conductivity has a width of 0.2 microns.

8. The method of claim 7, wherein said semiconductor device has a trench pitch of 0.8 microns.

9. The method of claim 1, wherein said spacers are comprised either of silicon dioxide or silicon nitride.

10. The method of claim 1, wherein said step of forming insulation plugs comprises the steps of:
    forming an oxide layer over said first mask layer such that said oxide layer at least fills each of said plurality of first openings;

forming a second mask layer over said oxide layer; and using said second mask layer to etch back said oxide layer such that said oxide layer remains in each of said plurality of first openings, thereby forming said insulation plugs.

11. The method of claim 10, wherein said second mask layer is composed of silicon nitride.

12. The method of claim 1, further comprising the step of forming a source electrode over said insulation plugs, said spacers, and said regions of said second conductivity.

13. A method of claim 1, further comprising the steps of:
etching a termination trench in said semiconductor body prior to patterning said first mask layer, said termination trench including a side wall and bottom and defining an active area that includes said trenches;

forming a field insulation body over said sidewall and said bottom of said termination trench;

forming an electrically conductive layer over said field insulation body and said first mask layer; and etching said electrically conductive layer along a portion that overlies said first mask layer to define a termination electrode in said termination trench.

14. The method of claim 13, wherein said step of forming insulation plugs comprises the steps of:

forming an oxide layer over said termination electrode and said first mask layer such that said oxide layer at least fills said plurality of first openings;

etching back said oxide layer along said termination trench and said active area to define said insulation plugs and to define a second insulation body that extends from said first mask layer and over a portion of said termination electrode.

15. The method of claim 1, further comprising the step of forming a channel region of a second conductivity in said semiconductor body.

* * * * *

UNITED STATES PATENT AND TRADEMARK OFFICE
CERTIFICATE OF CORRECTION

PATENT NO.        : 7,081,388 B2                                              Page 1 of 1
APPLICATION NO.   : 11/084265
DATED             : July 25, 2006
INVENTOR(S)       : David P. Jones It is certified that error appears in the above-identified patent and that said Letters Patent is hereby corrected as shown below:

On the title page, Item (75), change the third Inventor to:

--David P. Jones, South Glamorgan (GB)--.

Signed and Sealed this

Third Day of October, 2006

JON W. DUDAS
*Director of the United States Patent and Trademark Office*